United States Patent
Menard et al.

(10) Patent No.: US 7,036,312 B2
(45) Date of Patent: May 2, 2006

(54) MEMS ACTUATORS

(75) Inventors: Stéphane Menard, Kirkland (CA); Normand Lassonde, Pincourt (CA); Jean-Claude Villeneuve, Boisbriand (CA)

(73) Assignee: Simpler Networks, Inc., Dorval (CA)

( * ) Notice: Subject to any disclaimer, the term of this patent is extended or adjusted under 35 U.S.C. 154(b) by 0 days.

(21) Appl. No.: 10/782,708

(22) Filed: Feb. 17, 2004

(65) Prior Publication Data

US 2004/0211178 A1    Oct. 28, 2004

Related U.S. Application Data

(60) Provisional application No. 60/464,423, filed on Apr. 22, 2003.

(51) Int. Cl.
*F01B 29/10* (2006.01)

(52) U.S. Cl. .......................................... 60/527; 60/528
(58) Field of Classification Search ................... 60/527, 60/528, 529
See application file for complete search history.

(56) References Cited

U.S. PATENT DOCUMENTS

| | | | |
|---|---|---|---|
| 6,268,635 B1 | 7/2001 | Wood | |
| 6,407,478 B1 | 6/2002 | Wood et al. | |
| 6,608,714 B1* | 8/2003 | Hanson et al. | 359/296 |
| 6,655,964 B1* | 12/2003 | Fork et al. | 439/55 |
| 6,679,055 B1* | 1/2004 | Ellis | 60/527 |
| 6,691,513 B1* | 2/2004 | Kolesar | 60/527 |
| 6,708,491 B1* | 3/2004 | Weaver et al. | 60/527 |

FOREIGN PATENT DOCUMENTS

| WO | WO 02/17339 A | 2/2002 |
|---|---|---|
| WO | WO 02/23565 A | 3/2002 |

OTHER PUBLICATIONS

Burns D M et al Design and Performance of a double hot arm polysilicon thermal Actuator—XP009024459, no date.
Kolesar E S et al Design and Performance of a Polysilicon Surface Micromachined, no date.
Microengine realized with arrays of Asymmetrical electrothermal microactuators_XP001157164.

* cited by examiner

*Primary Examiner*—Hoang Nguyen
(74) *Attorney, Agent, or Firm*—Timothy J. Keefer; Seyfarth Shaw LLP

(57) ABSTRACT

The MEMS cantilever actuator is designed to be mounted on a substrate. The actuator comprises an elongated hot arm member having two spaced-apart portions, each provided at one end with a corresponding anchor pad connected to the substrate. The portions are connected together at a common end that is opposite the anchor pads. It further comprises an elongated cold arm member adjacent to and substantially parallel of the hot arm member, the cold arm member having at one end an anchor pad connected to the substrate, and a free end that is opposite the anchor pad thereof. A dielectric tether is attached over the common end of the portions of the hot arm member and the free end of the cold arm member. This MEMS actuator allows improving the performance, reliability and manufacturability of MEMS switches.

57 Claims, 17 Drawing Sheets

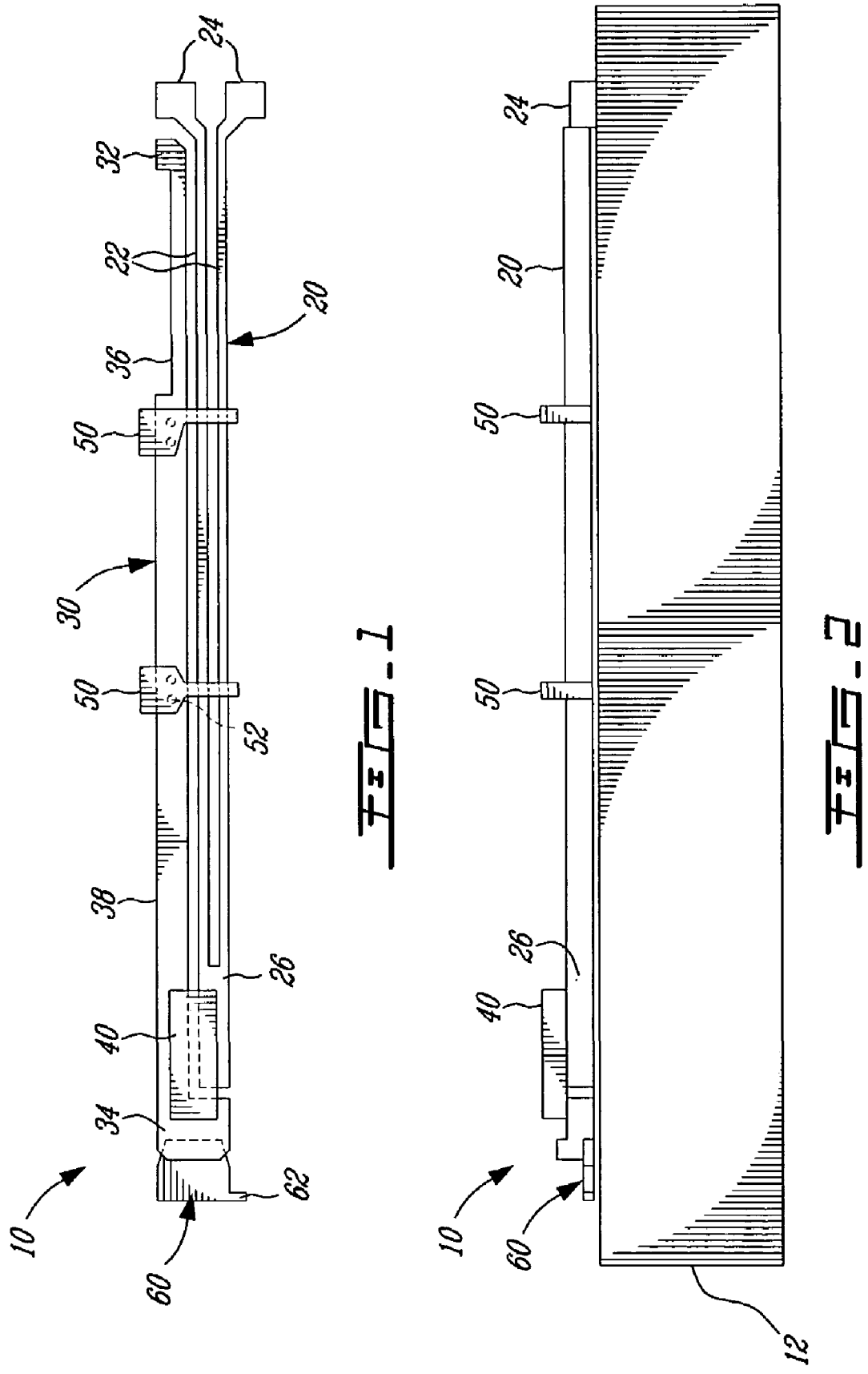

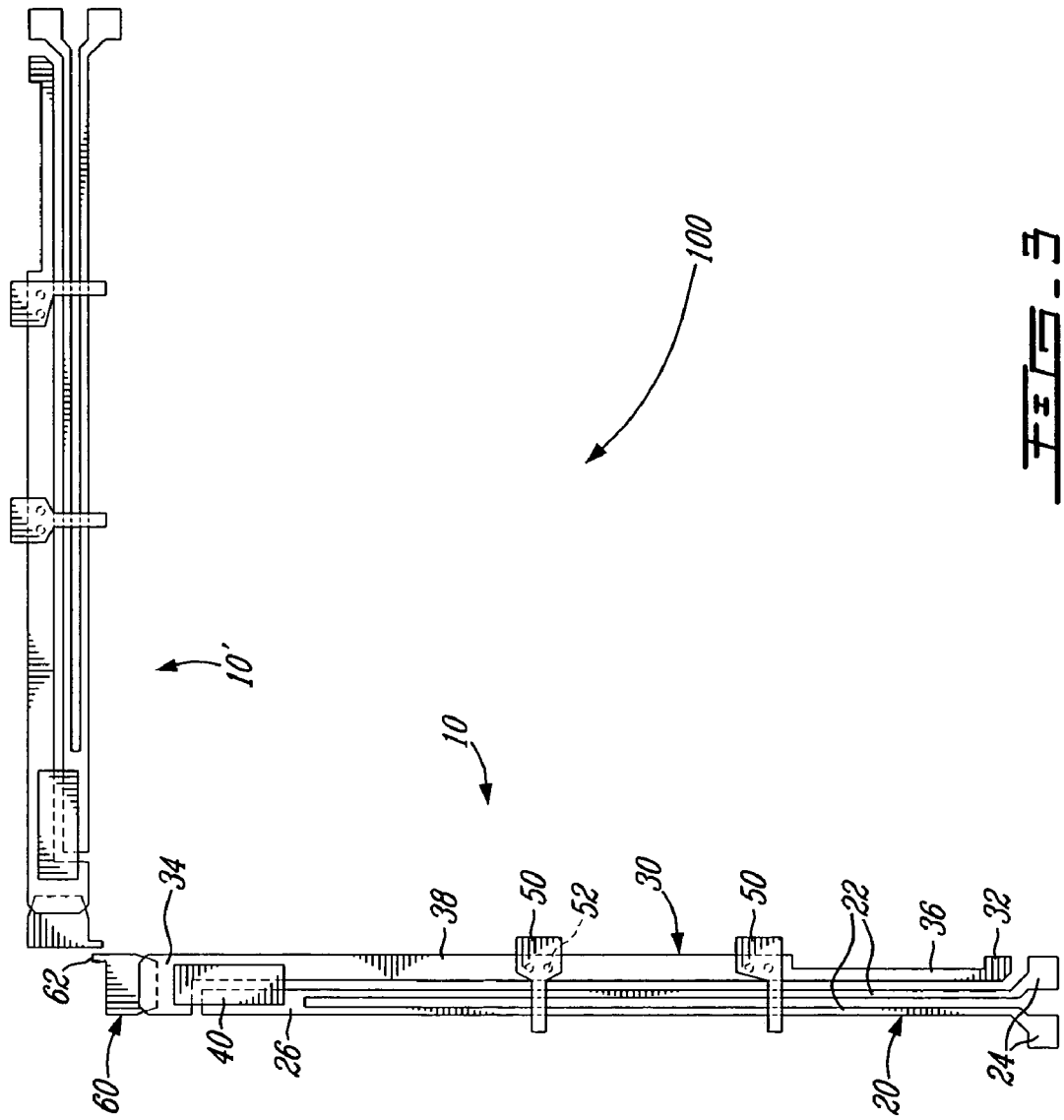

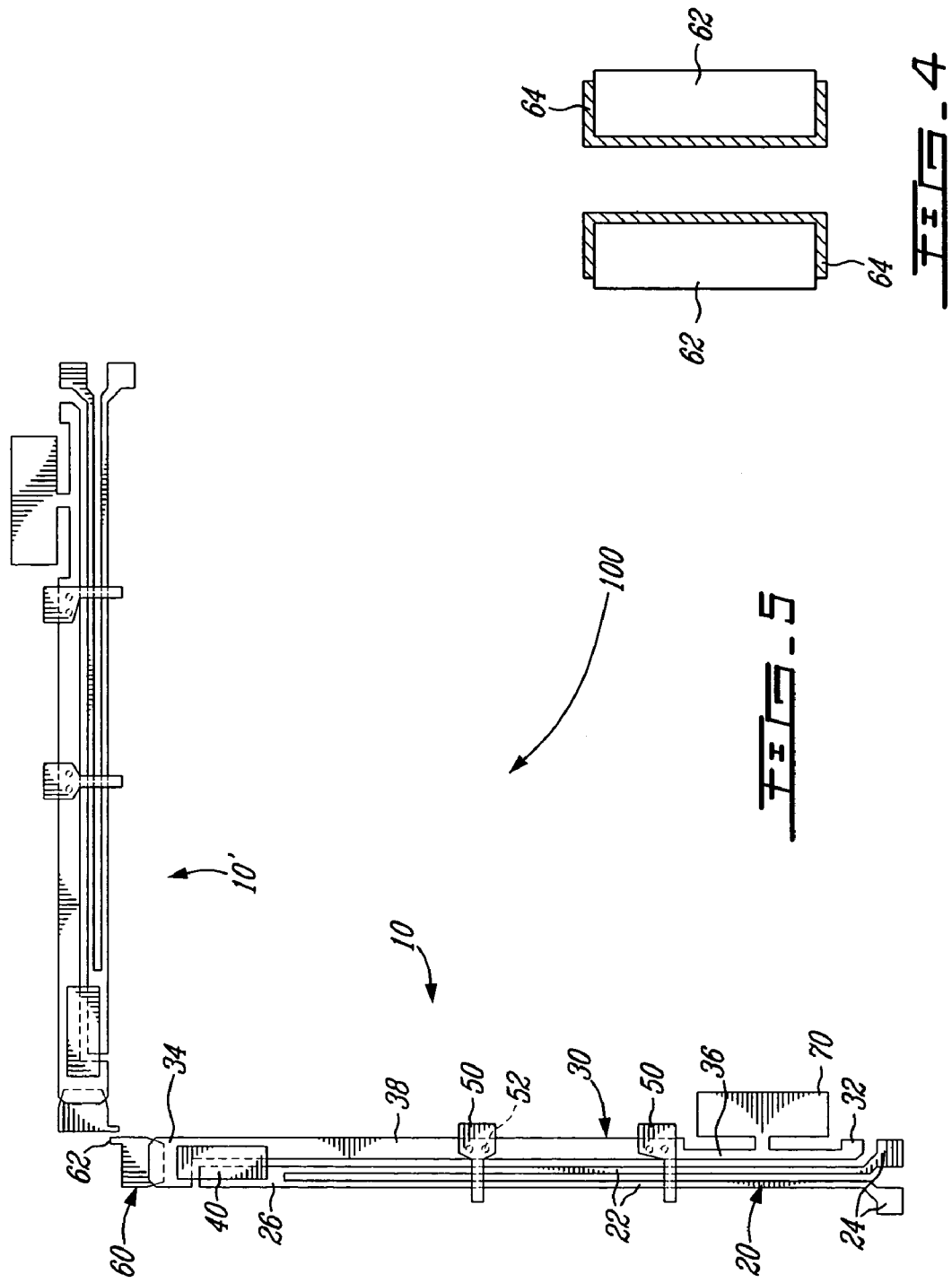

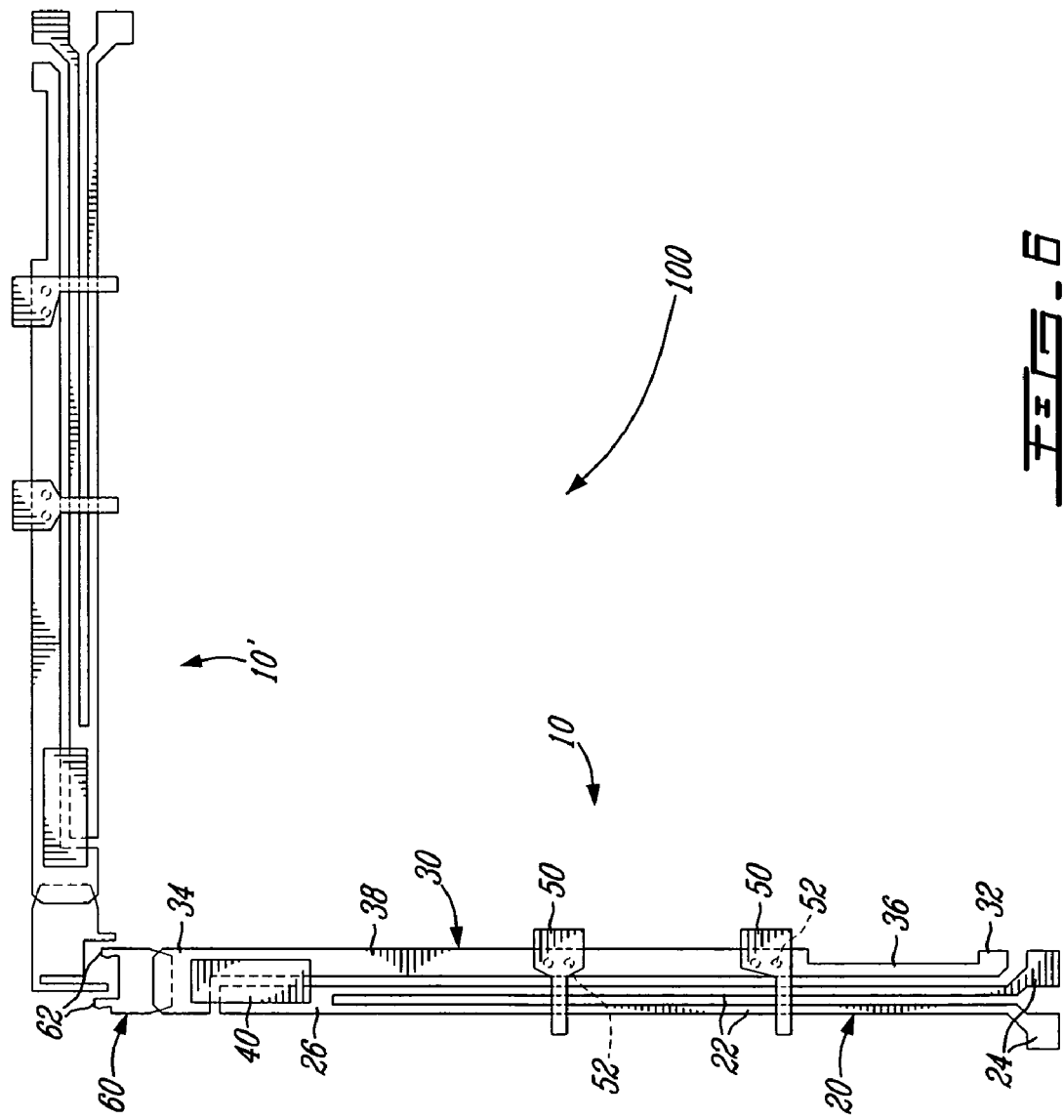

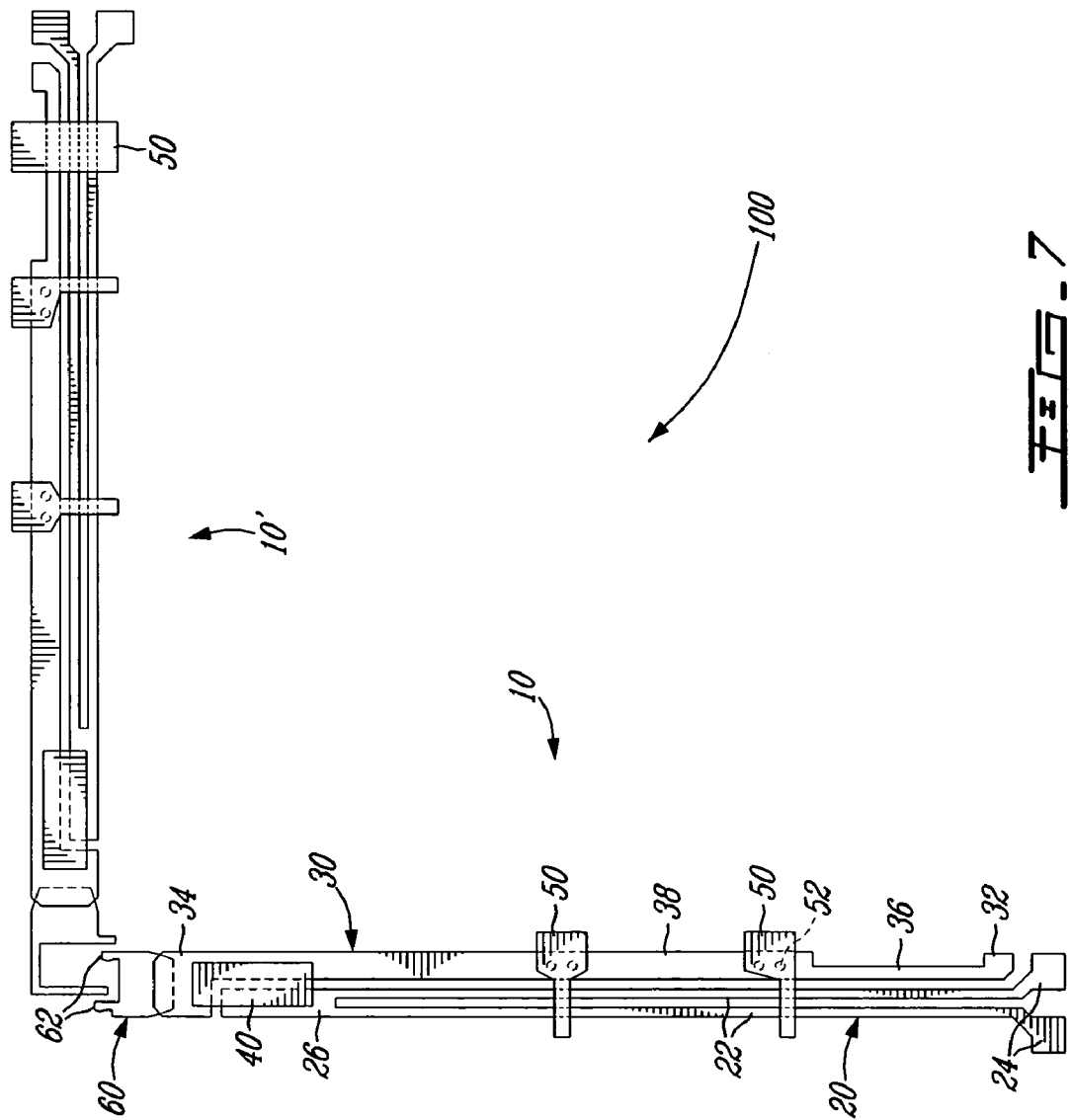

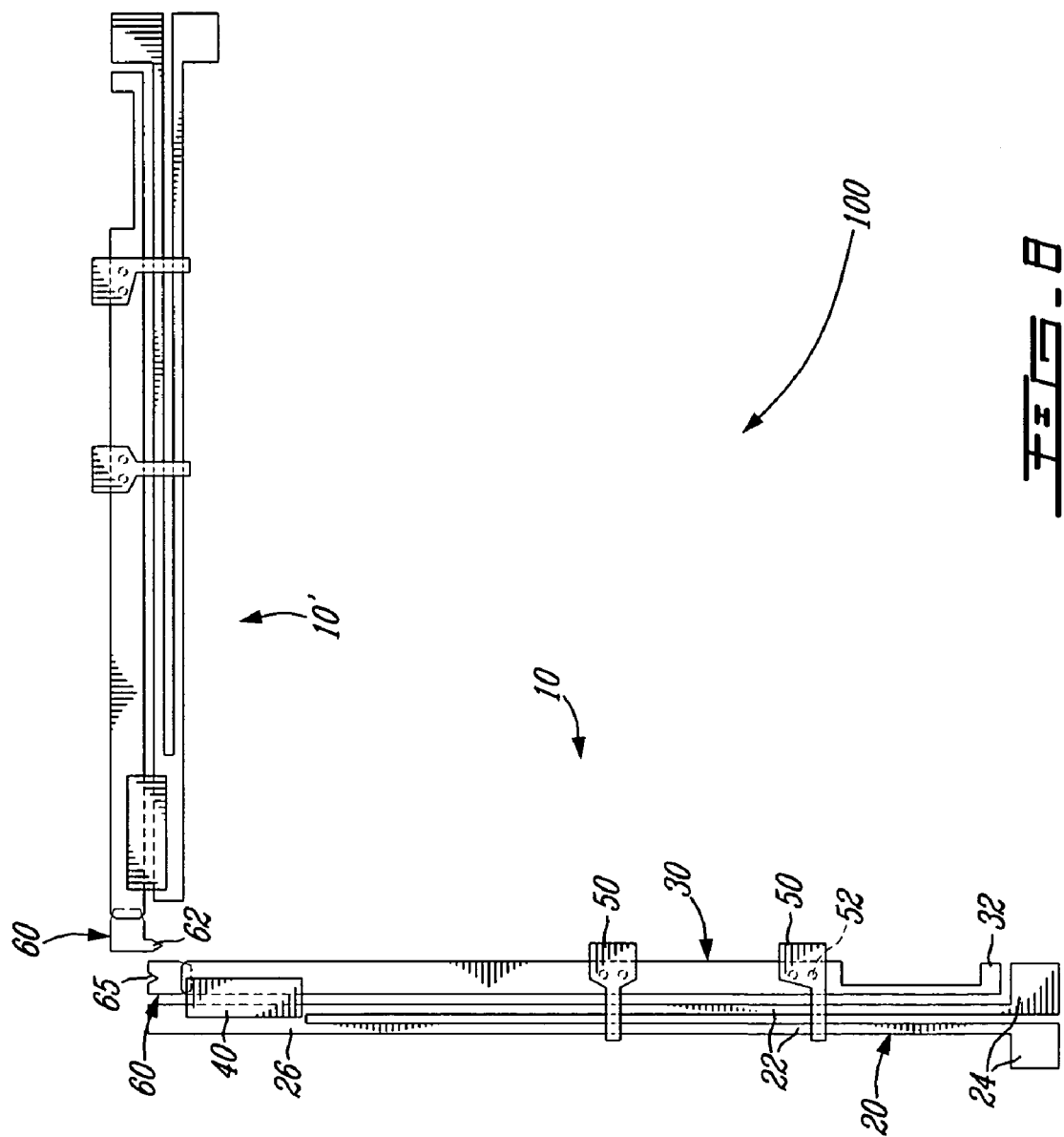

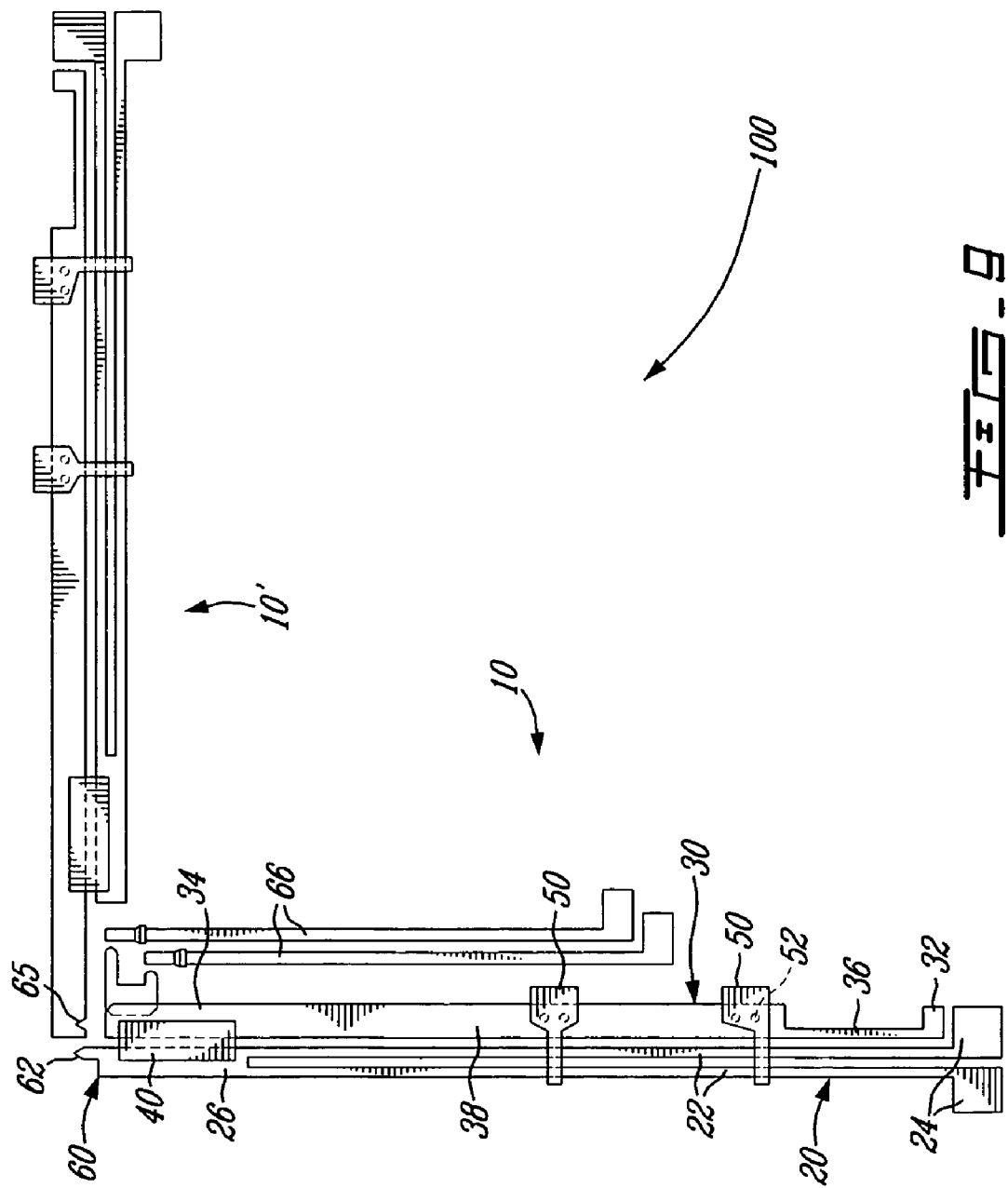

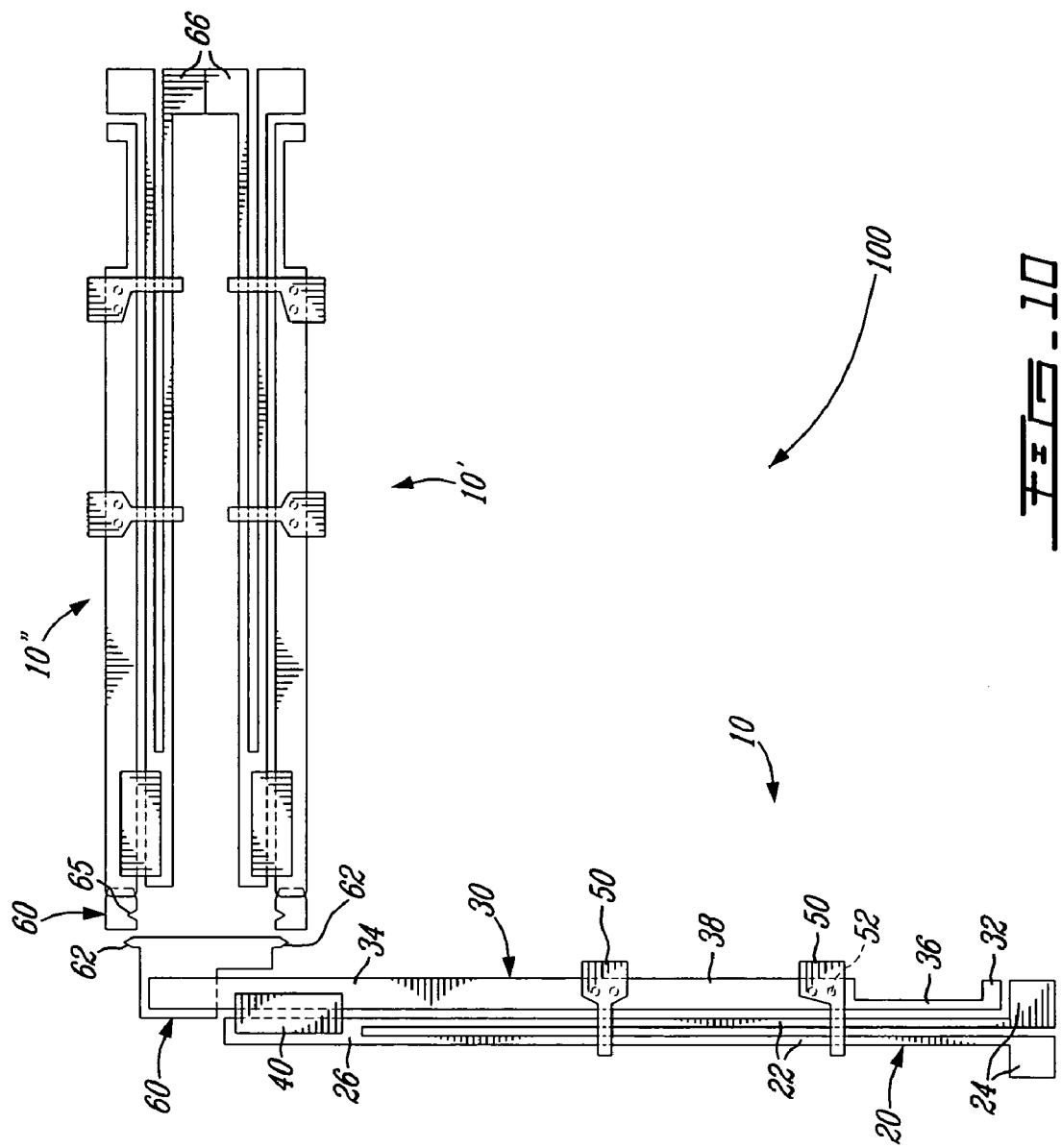

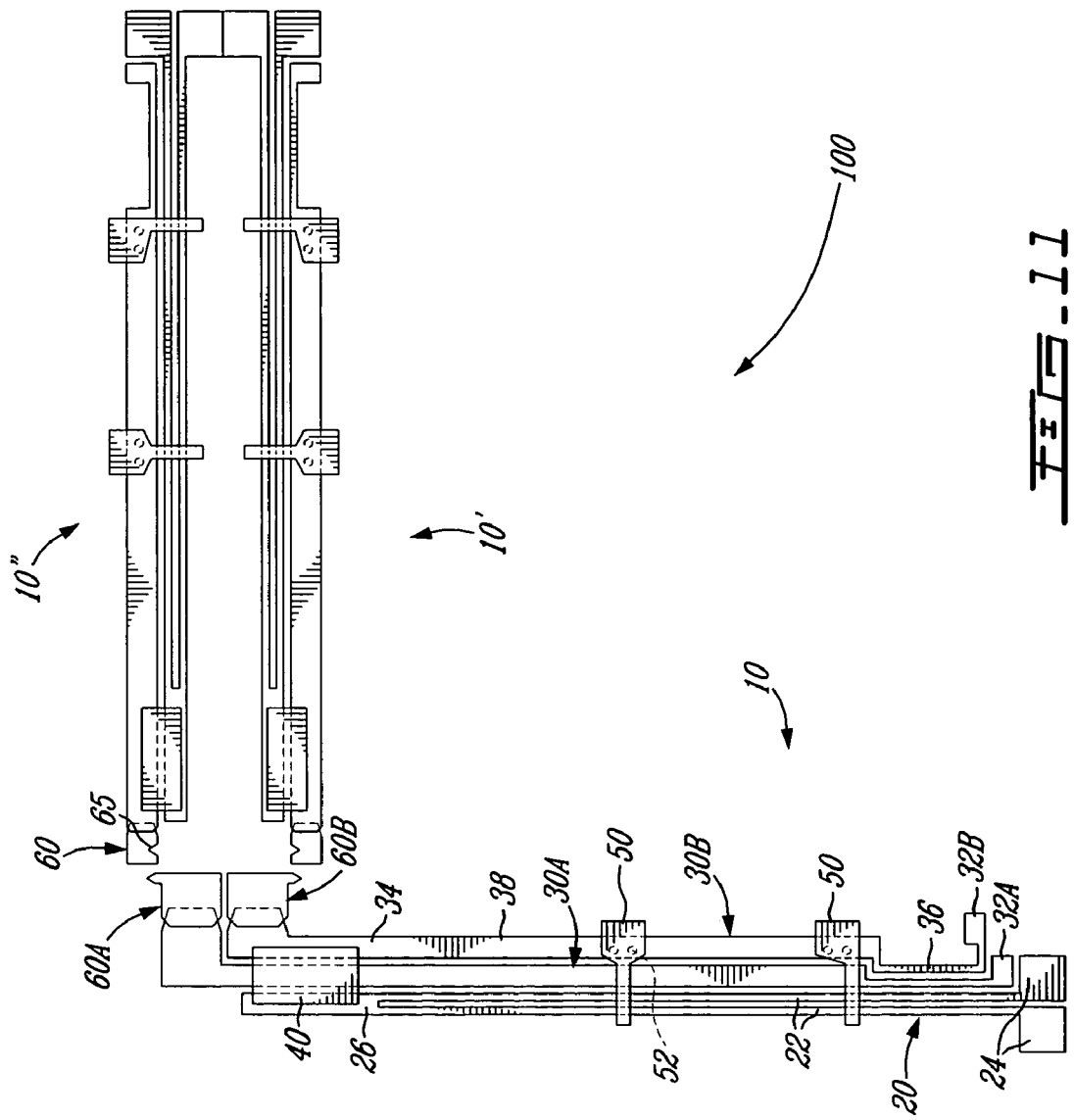

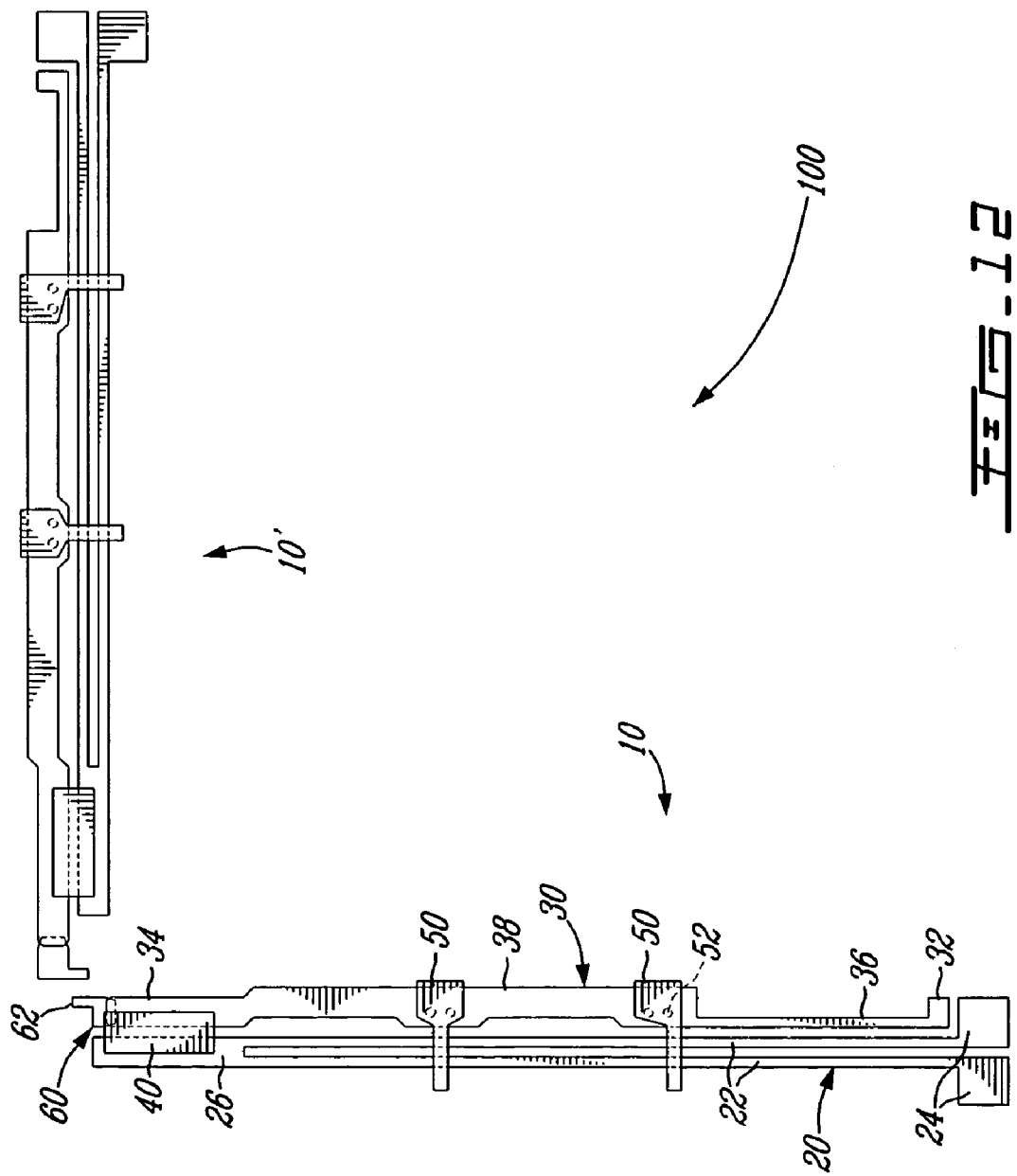

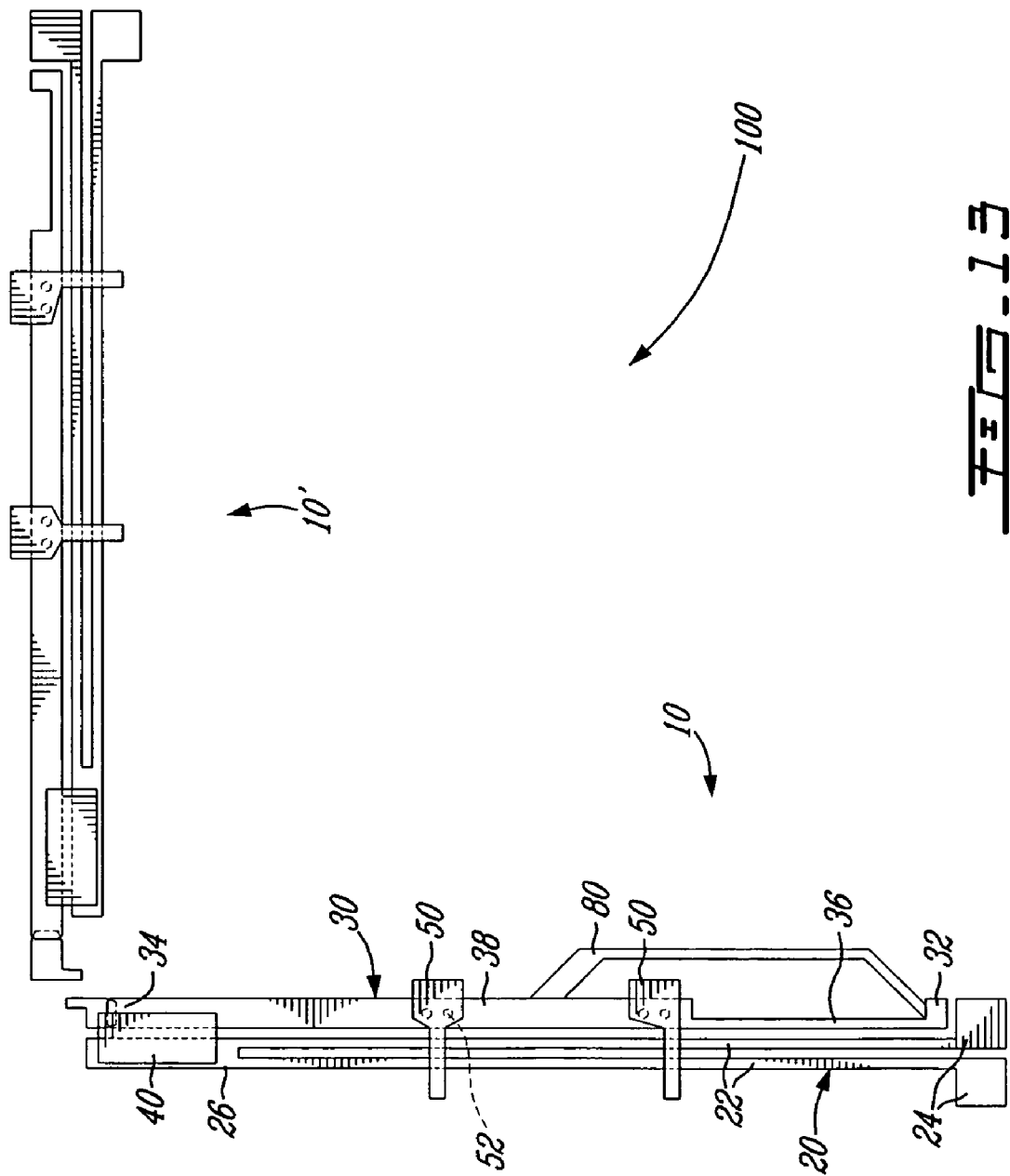

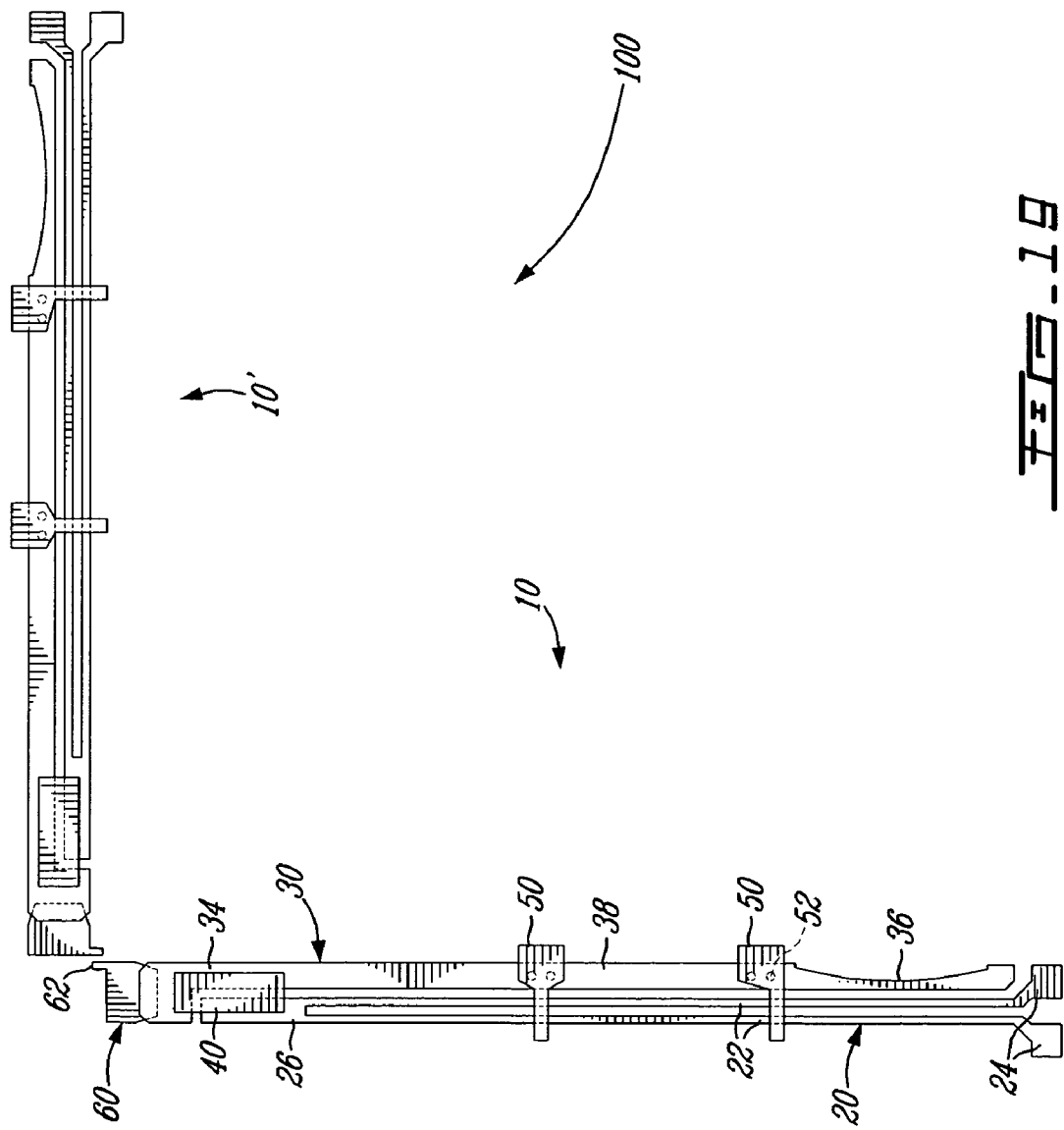

MEMS ACTUATORS

CROSS-REFERENCE TO PRIOR APPLICATION

The present application claims the benefits of U.S. provisional patent application No. 60/464,423 filed Apr. 22, 2003, which is hereby incorporated by reference.

BACKGROUND

Microelectromechanical systems (MEMS) are very small movable mechanical structures built using standard semiconductor processes. MEMS can be provided as actuators, which are very useful in many applications. These actuators are typically having a length of a few hundreds of microns, sometimes with only a few tens of microns in width. A MEMS actuator is usually configured and disposed in a cantilever fashion. It thus has an end attached to a substrate and an opposite free end which is movable between at least two positions, one being a neutral position and the others being deflected positions.

The most common actuation mechanisms used in the industry are electrostatic, magnetic, piezo and thermal. The actuation mechanism discussed herein is of a thermal type. The deflection of a thermal MEMS actuator results from a potential being applied between a pair of terminals, called "anchor pads", which potential causes a current flow elevating the temperature of the structure. This ultimately causes a part thereof to contract or elongate, depending on the material being used.

One possible use for MEMS actuators is to configure them as switches. These switches are made of at least one actuator. In the case of multiple actuators, they are operated in sequence so as to connect or release one of their parts to a similar part on the other. The actuator or actuators can be single hot arm actuators or double hot arm actuators, depending on the design. Other kinds of actuators exist as well, including some with more than two hot arm members. These actuators form a switch which can be selectively opened or closed using a control voltage applied at corresponding anchor pads on each actuator.

Because they are extremely small, each actuator being about a few hundreds of microns in length and a few tenths of microns in width, a very large number of MEMS switches can be provided on a single wafer.

MEMS switches have many advantages. Among other things, they are very small and inexpensive, depending on the configuration. Typically, the power consumption is also very minimal and their response time is extremely short. The complete sequence for closing or opening a MEMS switch can be as short as a few milliseconds.

Although previously existing MEMS actuators and switches were satisfactory to some degree, there was still a need to further improve their performance, reliability and manufacturability.

SUMMARY

In accordance with a first aspect of the present invention, there is provided a MEMS cantilever actuator mounted on a substrate, the actuator comprising:

an elongated hot arm member having two spaced-apart portions, each provided at one end with a corresponding anchor pad connected to the substrate, the portions being connected together at a common end that is opposite the anchor pads;

an elongated cold arm member adjacent and substantially parallel to the hot arm member, the cold arm member having at one end an anchor pad connected to the substrate, and a free end that is opposite the anchor pad thereof; and a dielectric tether attached over the common end of the portions of the hot arm member and the free end of the cold arm member to mechanically couple the hot arm member and the cold arm member and keep them electrically independent.

In accordance with another aspect of the present invention, there is provided a MEMS switch mounted on a substrate, the switch comprising:

a first cantilever actuator comprising:
  a first elongated hot arm member having two spaced-apart portions, each provided at one end with a corresponding anchor pad connected to the substrate, the portions of the first hot arm member being connected together at a common end that is opposite their anchor pads;
  a first elongated cold arm member adjacent and substantially parallel to the first hot arm member, the first cold arm member having at one end an anchor pad connected to the substrate, and a free end that is opposite the anchor pad thereof; and
  a first dielectric tether attached over the common end of the portions of the first hot arm member and the free end of the first cold arm member to mechanically couple the first hot arm member and the first cold arm member and keep them electrically independent; and a second cantilever actuator comprising:
  a second elongated hot arm member having two spaced-apart portions, each provided at one end with a corresponding anchor pad connected to the substrate, the portions of the second hot arm member being connected together at a common end that is opposite their anchor pads;
  a second elongated cold arm member adjacent and substantially parallel to the second hot arm member, the second cold arm member having at one end an anchor pad connected to the substrate, and a free end that is opposite the anchor pad thereof; and
  a second dielectric tether attached over the common end of the portions of the second hot arm member and the free end of the second cold arm member to mechanically couple the second hot arm member and the second cold arm member and keep them electrically independent;

wherein the first actuator and the second actuator are configured and disposed so that the switch is selectively movable between a closed position where the free ends of the cold arm members are electrically engaged, and an open position where the cold arm members are electrically independent.

In accordance with a further aspect of the present invention, there is provided a method of manufacturing a MEMS cantilever actuator to be mounted on a substrate, the method comprising:

providing an elongated hot arm member having two spaced-apart portions, each provided at one end with a corresponding anchor pad connected to the substrate, the portions being connected together at a common end that is opposite the anchor pads;

providing an elongated cold arm member adjacent and substantially parallel to the hot arm member, the cold arm member having at one end an anchor pad connected to the substrate, and a free end that is opposite the anchor pad thereof; and providing a dielectric tether over the common end of the portions of the hot arm member and the free end of the cold arm member to mechanically couple the hot arm member and the cold arm member and keep them electrically independent.

The details of these and also other aspects of the present invention are provided in the following detailed description, which is made with reference to the accompanying figures that are briefly described hereafter.

BRIEF DESCRIPTION OF THE FIGURES

FIG. 1 is a top plan view of a MEMS actuator in accordance with a preferred embodiment.

FIG. 2 is a side view of the actuator shown in FIG. 1.

FIG. 3 is a top plan view of a MEMS switch using two perpendicularly-disposed actuators as in FIG. 1.

FIG. 4 is an enlarged schematic side view of electrically-insulated lateral contact flanges in accordance with a preferred embodiment.

FIGS. 5 to 19 are top plan views illustrating other possible variants of the MEMS switch with perpendicularly-disposed actuators.

DETAILED DESCRIPTION

Figure 14:
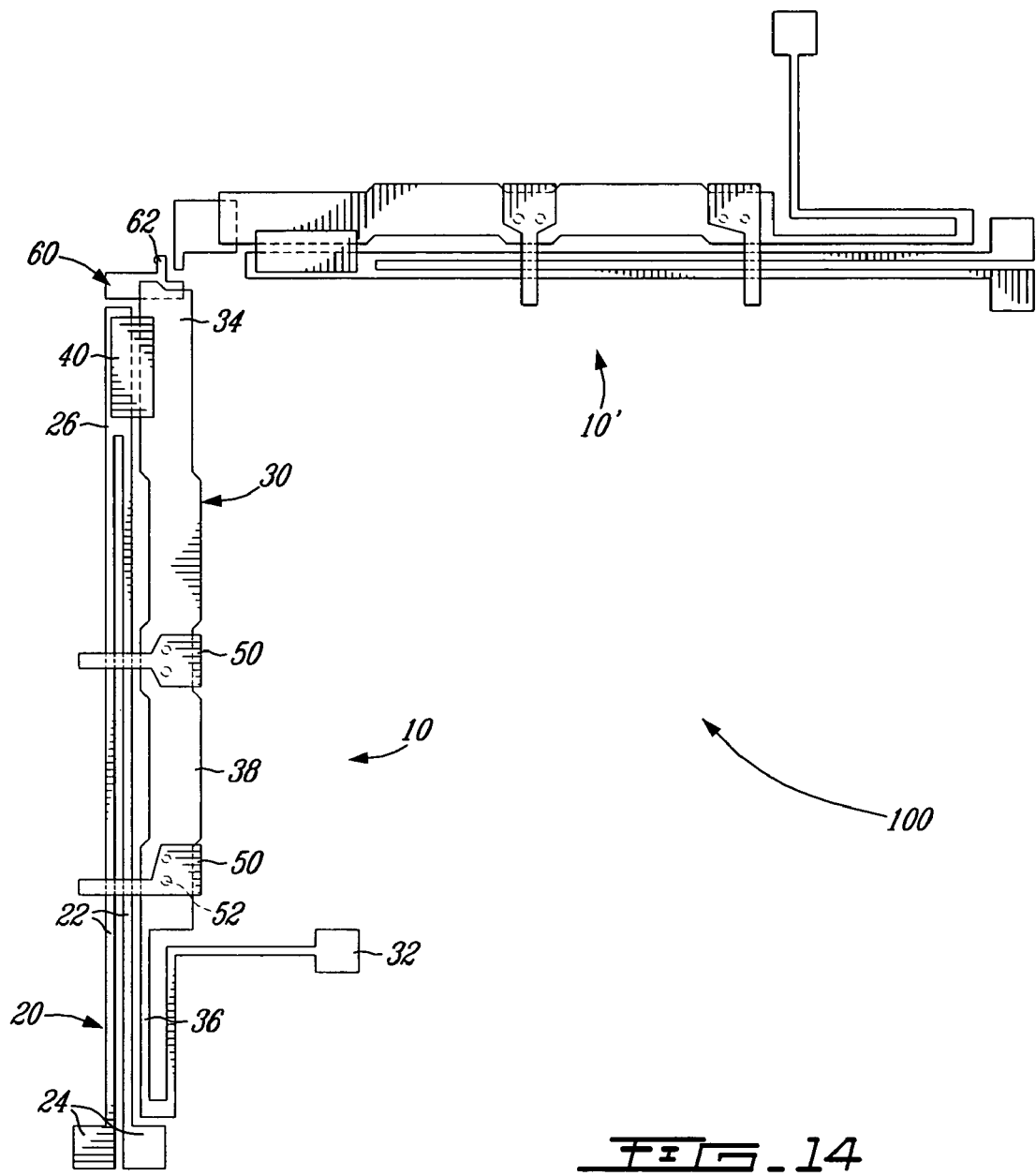

A MEMS cantilever actuator (10) and a MEMS switch (100) according to various possible embodiments are described hereinafter and illustrated in the appended figures. A method of manufacturing a MEMS actuator (10) is also described. It must be noted that various changes and modifications may be effected therein without departing from the scope of the present invention as defined by the appended claims.

Some actuator parts shown in FIG. 3 and FIGS. 5 to 19 are not referred to by numbers to simplify the figures. These parts correspond to identical or similar actuator parts identified by numbers in the same figure.

Referring first to FIGS. 1 and 2, there is shown an example of a MEMS cantilever actuator (10) mounted on a substrate (12) in accordance with a preferred embodiment. The free end of the actuator (10) is capable of being moved because of the asymmetrical configuration thereof. The actuator (10) comprises an elongated hot arm member (20) having two spaced-apart portions (22), each being provided at one end with a corresponding anchor pad (24) connected to the substrate (12). The portions (22) are parallel and connected together at a common end (26) that is opposite the anchor pads (24) and overlying the substrate (12), as shown in FIG. 2. The actuator (10) also comprises an elongated cold arm member (30) adjacent and substantially parallel to the hot arm member (20). The cold arm member (30) has at one end an anchor pad (32) connected to the substrate (12), and a free end (34) that is opposite the anchor pad thereof (32). The free end (34) is overlying the substrate (12).

A dielectric tether (40) is attached over the common end (26) of the portions (22) of the hot arm member (20) and the free end (34) of the cold arm member (30). The dielectric tether (40) is used to mechanically couple the hot arm member (20) and the cold arm member (30) and keep them electrically independent, thereby maintaining them in a spaced-apart relationship with a minimum spacing between them to avoid a direct contact or a short circuit in normal operation as well as to maintain the required withstand voltage, which voltage is proportional to the spacing between the members (20,30). The dielectric tether (40) is molded directly in place at the desired location and is attached by direct adhesion. Direct molding further allows having a small quantity of material entering the space between the parts before solidifying. It should be noted that the dielectric tether (40) can be attached to the hot arm member (20) and the cold arm member (30) in a different manner than the one shown in FIG. 1.

As can be appreciated, the dielectric tether (40) is located over the actuator (10), namely on the opposite side with reference to the substrate (12). This has many advantages over previous MEMS actuators for which the dielectric tether, usually made of glass, was provided under the hot arm member (20) and the cold arm member (30). Typically the dielectric tether made of glass and located under the actuator used thin layers of silicon oxide or nitride, which layers were very fragile. Such dielectric tethers also increased the complexity of the manufacturing process.

The dielectric tether (40) is preferably made entirely of a photoresist material. It was found that a very suitable material for that purpose and easy to manufacture is the material known in the trade as "SU-8". The SU-8 is a negative, epoxy-type, near-UV photo resist based on EPON SU-8 epoxy resin (from Shell Chemical) that has been originally developed by IBM. It should be noted that other photoresist do exist and can be used as well, depending on the design requirements. Other possible suitable materials include polyimide, spin on glass or other polymers. Moreover, combining different materials is also possible. Providing the dielectric tether (40) over the actuator (10) is advantageous because it allows to use the above-mentioned materials, which in return provide more flexibility on the tether material and a greater reliability.

In use, when a control voltage is applied at the anchor pads (24) of the hot arm member (20), a current travels into the first portion (22) and the second portion (22). In the illustrated embodiment, the material used for making the hot arm member (20) is selected so that it increases in length as it is heated. The cold arm member (30), however, does not have such elongation since no current is initially passing through it. The result is that the free end of the actuator (10) is deflected sideward because of the asymmetrical configuration of the parts, thereby moving the actuator (10) from a neutral position to a deflected position. Conversely, taking away the control voltage allows to cool the hot arm member (20) and move it to its original position. Both movements occur very rapidly.

Preferably, the cold arm member (30) comprises a narrower section (36) adjacent to its anchor pad (32) in order to facilitate the movement between the deflected position and the neutral position. The narrower section (36) has a width laterally decreased from the exterior compared to a wider section (38) of the cold arm member (30). In the preferred embodiment, the width decrease is at a square angle. Other shapes are possible, as shown in FIG. 19, where the narrow section (36) is parabolic.

The actuator (10) in the embodiment shown in FIG. 1 includes a set of two spaced-apart additional dielectric tethers (50). These additional dielectric tethers (50) are transversally disposed over the portions (22) of the hot arm member (20) and over the cold arm member (30). They adhere to these parts. It is advantageous to provide at least one of these additional dielectric tethers (50) on an actuator (10) to provide additional strength to the hot arm member (20) by reducing their effective length in order to prevent distortion of the hot arm member (20) over time. Since the gap between the parts is extremely small, the additional tethers (50) would reduce the risks of a short circuit to happen between the two portions (22) of the hot arm member (20) or between the portion (22) of the hot arm member (20) which is the closest to the cold arm member (30) and the cold arm member (30) itself by keeping them in a spaced-apart configuration. Another problem is that since the cold arm member (30) can be used to carry high voltage signals, the portion (22) of the hot arm member (20) closest to the cold arm member (30) will deform, moving it towards the cold arm member (30), due to the electrostatic force between them created by the high voltage signal. If the portion (22) of the hot arm member (20) gets too close to the cold arm member (30), a voltage breakdown can occur, destroying the MEMS switch (100). Additionally, since the two portions (22) of the hot arm member (20) are relatively long, they tend to distort when heated to create the deflection, thereby decreasing the effective stroke of the actuators (10).

As can be appreciated, using one, two or more additional dielectric tethers (50) has many advantages, including increasing the rigidity of the portions (22) of the hot arm member (20), increasing the stroke of the actuator (10), decreasing the risks of shorts between the portions (22) of the hot arm member (20) and increasing the breakdown voltage between the cold arm member (30) and hot arm members (20).

The additional dielectric tethers (50) are made of a material identical or similar to that of the main dielectric tether (40). Small quantities of materials are advantageously allowed to flow between the parts before solidifying in order to improve the adhesion. Yet, one or more holes (52) can be provided in the cold arm member (30) to receive a small quantity of material before it solidifies.

FIG. 1 further shows that the actuator (10) of the preferred embodiment comprises a tip member (60) attached to the free end of the cold arm member (30). The actuator (10) may otherwise be constructed without a tip member (60). The surface of the tip member (60) is preferably designed so as to lower the contact resistance when two of such tip members (60) make contact with each other. This is obtained in the preferred embodiment by using a tip member (60) made of gold, either entirely made of gold or gold-over plated.

Other possible materials include a gold-cobalt alloy, palladium, etc. They provide a lower contact resistance compare to nickel, which is the preferred material for the cold arm member (30). The hot arm member (20) is also preferably made of nickel. Other materials can be used for the hot arm member (20) and the cold arm member (30).

FIG. 2 shows that the tip member (60) is attached in the preferred embodiment under the free end (34) of the cold arm member (30). It is preferably attached using the natural adhesion of the materials when plated over each other, although other means can be used as well.

Referring back to FIG. 1, one can see that the tip member (60) of the actuator (10) of the preferred embodiment comprises a lateral contact flange (62). This flange (62) is useful for connecting two substantially-perpendicular actuators (10), as shown in FIG. 3. Such arrangement creates a MEMS switch (100). The MEMS switch (100) has two positions, namely a closed position where the first actuator (10) and the second actuator (10') are electrically engaged, and an open position where they are electrically independent, thus where there is no electrical contact between the cold arm members (30). To move from one position to the other, the actuators (10,10') are operated in sequence. Briefly stated, the tip member (60) of the second actuator (10') in FIG. 3 is deflected upward. Then, the tip member (60) of the first actuator (10) is deflected to its right. The control voltage is released in the second actuator (10'), which causes its flange (62) to engage the back side of the flange (62) of the first actuator (10) as it returns towards its neutral position. The control voltage of the first actuator (10) is subsequently released, thereby allowing a stable electrical engagement between both cold arm members (30). A signal or simply a current can then be transmitted between both corresponding anchor pads (32) of the cold arm members (30). The closing of the MEMS switch (100) is very rapid, all this occurring in typically a few milliseconds. Setting the MEMS switch (100) to the open position is done by reversing the above-mentioned operations.

FIG. 4 shows an enlarged view of the flanges (62) of the two actuators (10,10') when they are electrically independent. Advantageously, these flanges (62) have one side that is provided with an electrical insulation layer (64). When the MEMS switch (100) is closed, both flanges (62) are in electrical engagement and the electrical current can flow between them. Conversely, when the MEMS switch (100) is open, the flanges (62) are only separated by a very small gap. The smaller the gap is, the smaller the breakdown voltage between the signal input to the signal output will be, namely between the two flanges (62). The electrical insulation layer (64) is provided to increase the voltage breakdown between the flanges (62) of an opened MEMS switch (100), as shown. They emulate a larger air gap. The preferred insulating material for the electrical insulation layer (64) is a parylene. Other materials can be used as well.

As aforesaid, cold arm members (30) of the actuators (10,10') are advantageously provided with a narrower section (36) near their anchor pads (32). This gives the actuators (10,10') some flexibility, thus the ability to deflect more easily. The width of the cold arm member (30) at that section (36) is thus substantially smaller than that of the wider section (38) thereof. One drawback of such smaller width is that a current passing through the cold arm member (30) generates more heat at the narrower section (36) than elsewhere. That increased heat may, at some point, overheat the narrower section (36) of the cold arm member (30) and create a failure.

A solution to the above-mentioned problem is to provide a heat sink (70) projecting from the side of each narrower section (36), as shown in FIG. 5. These heat sinks (70) are preferably in the form of a plate attached to the interior of the narrower section (36) in order to increase the surface from which heat can be dissipated. It should be noted that the heat sinks (70) can be used without the additional dielectric tethers (50). Moreover, a MEMS switch (100) may comprise only one actuator (10,10') with a heat sink (70).

FIG. 6 illustrates a MEMS switch (100) in which the tip member (60) of the actuators (10,10') are provided with two flanges (62) instead of just one. This maximizes the contact area and splits the current in two, thereby reducing the heat at each flange (62). FIG. 7 shows a variant in the design of the tip member (60). It should be noted that one may choose to design a MEMS switch (100) with actuators (10,10') that are constructed differently. For instance, the first actuator (10) may be provided with additional dielectric tethers (50) while the second actuator (10') does not have one. In FIG. 7, the second actuator (10') is illustrated with a third additional dielectric tether (50) positioned at the narrower section (36) of the cold arm member (30).

FIGS. 6 and 7 further show that the flanges (62) of the first actuator (10) are provided, on one side thereof, with a rounded electrical contact surface. This feature can be used on one or more of the flanges (62) of many of the illustrated embodiments. This shape enhances the electrical contact between two flanges (62).

FIG. 8 illustrates a MEMS switch (100) in which one tip member (60) has a flange (62), preferably with a pointed free end, while the other tip member (60) only has an indentation (65) to receive the free end of the flange (62). Electrical engagement occurs when the free end of the flange (62) is inserted in the indentation (65).

In FIG. 9, the MEMS switch (100) comprises two independent side arm members (66) adjacent to the first actuators (10). This embodiment can also be constructed with only one or more than two independent side arm members (66). Electrical contact is made between the cold arm member (30) of the first actuator (10) and the independent side arm members (66) when the MEMS switch (100) is closed.

FIG. 10 shows a MEMS switch (100) provided with a third actuator (10"). This third actuator (10") is adjacent to the second actuator (10') and is symmetrically disposed on the side thereof. The tip member (60) of the first actuator (10) is then provided with two flanges (62), each configured and disposed to fit into a corresponding indentation (65) in the tip member (60) of the second (10') and the third actuator (10"). In use, the adjacent actuators (10',10") are activated to open in opposite directions. The first actuator (10) is then activated to move between them. The control voltage on the adjacent actuators (10',10") is released and finally, the control voltage on the first actuator (10) is released. All this allows to set the MEMS switch (100) in the closed position. Opening of the MEMS switch (100) is done in the reversed order.

FIG. 11 illustrates a variant of the MEMS switch (100) shown in FIG. 10. This embodiment has the first actuator (10) being provided with dual cold arm members (30A, 30B), each being electrically independent. Each cold arm member (30A,30B) has a corresponding anchor pad (32A, 32B) at one end and a corresponding tip member (60A,60B) at another end. The first cold arm member (30A) of the first actuator (10) can electrically engage the cold arm member of the third actuator (10") and the second cold arm member (30B) of the first actuator (10) can electrically engage the cold arm member of the second actuator (10').

FIG. 12 illustrates another possible embodiment for the MEMS switch (100). Each actuator (10,10') of this MEMS switch (100) has a cold arm member (30) designed in such a way that subsections in the wider section (38) thereof have an increased interspace with the corresponding hot arm member (20) in order to increase the breakdown voltage between the hot arm member (20) and the cold arm member (30). It also shows that the narrower section (36) of the actuators (10,10') can have a different length.

In FIG. 13, the cold arm member (30) of the first actuator (10) is provided with a by-pass segment (80) between at least opposite ends of the narrower section (36). The by-pass segment (80) allows to reduce the current in the narrow section (36). Splitting the current between the narrower section (36) and the by-pass section (80) will reduce the heat in the narrower section (36), thereby preventing some potential failure from happening. The temperature in the narrower section (36) is thus less than without the by-pass segment (80). The advantage of such configuration is that since the temperature rise is less, there is less elongation of the cold arm member (30) when the MEMS switch (100) is closed and a signal is going through. This elongation proved to be problematic in some designs because of the force that was applied against the tip member (60) of the second actuator (10'). When the heat is excessive, permanent deformations may occur because of the absence of any degree of freedom. This problem can be solved by the by-pass segment (80). It should be noted that by-pass segments (80) can be used on both actuators (10,10') at the same time.

FIG. 14 illustrated another possible embodiment. In this embodiment, the cold arm member (30) has a U-shaped narrower section (36). Since the cold arm member (30) is only attached to the substrate by the anchor pad (32), the U-shaped narrower section (36) allows it to expand, when heated, without causing a force to be applied at the tip member (60) thereof. Moreover, the first straight portion of the narrower section (36) from the anchor pad (32) is slightly flexible, thereby allowing to compensate any stress that it may have in the cold arm member (30).

Figure 15:
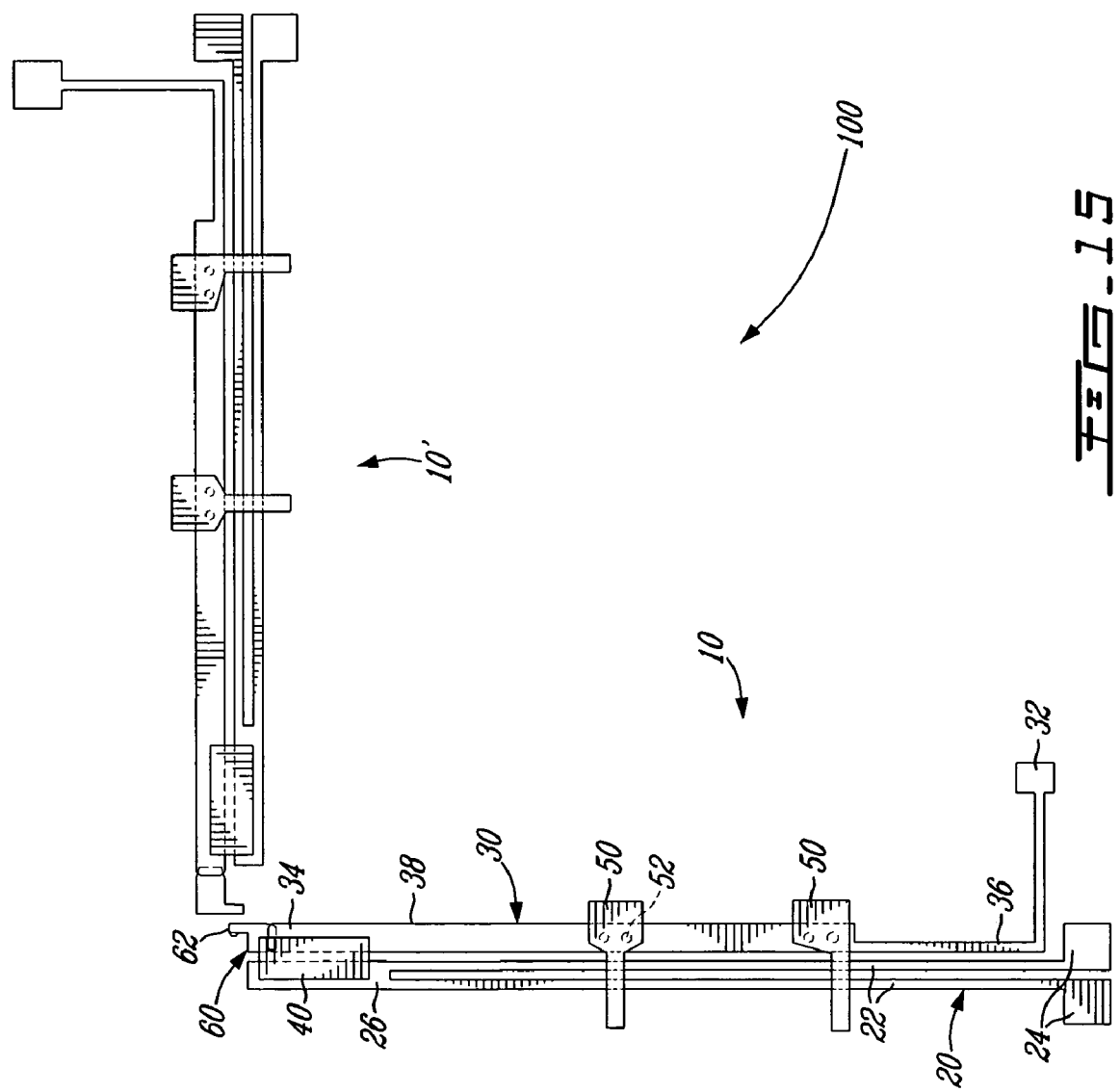

In FIG. 15, the narrower section (36) of each actuator (10,10') is L-shaped. The flexibility of the first portion of the narrower section (36), from the anchor pad (32), allows to compensate for any elongation of the portion of the narrower section (36) parallel to the longitudinal axis of each actuator (10,10'). It should be noted that L-shaped narrower sections (36) can be used without the increased interspace, as illustrated.

Figure 16:
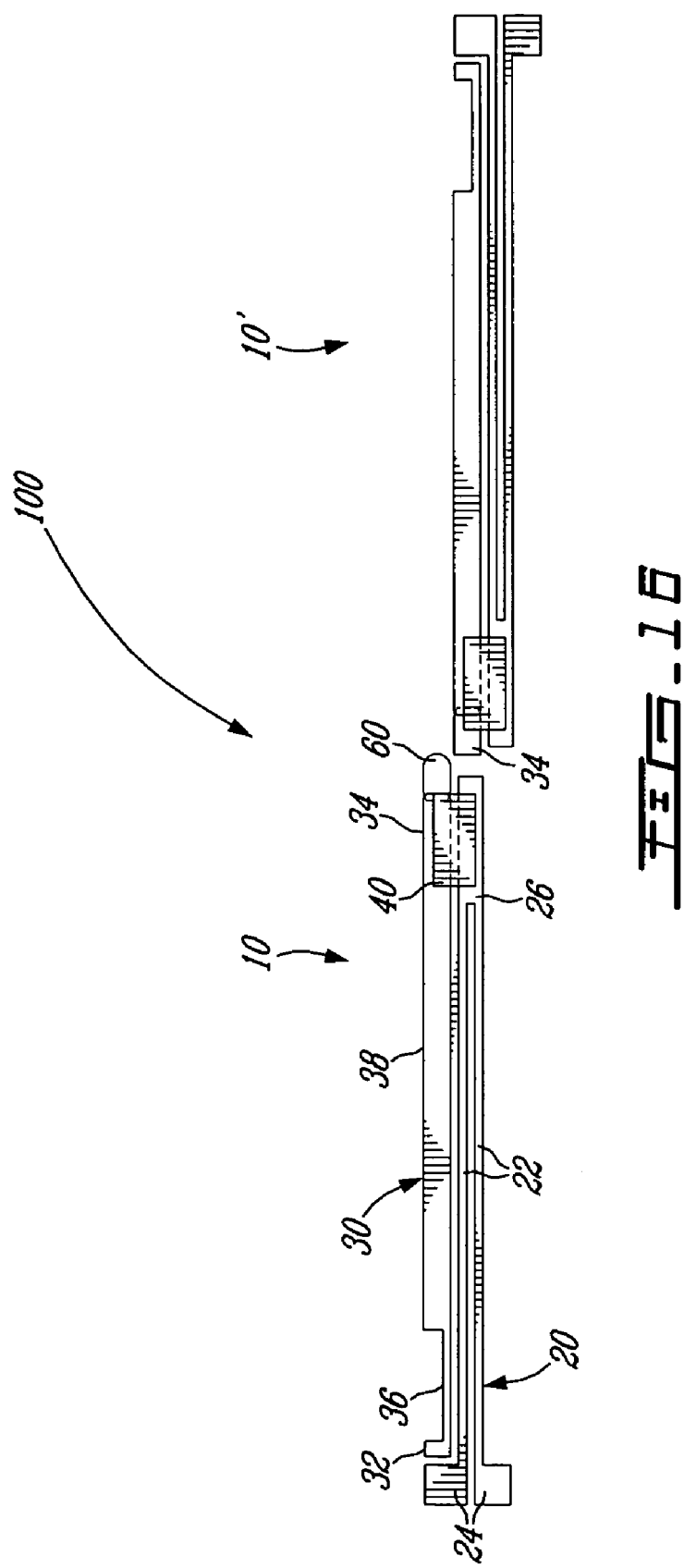

FIG. 16 shows another alternative configuration for the MEMS switch (100). In this embodiment, the actuators (10,10') are configured and disposed so that their free ends

(34) or tip members (60) are in interfering engagement when the MEMS switch (100) is closed, and out of engagement when the MEMS switch (100) is open. Tip members (60) are used in the illustrated embodiment. The two actuators (10, 10') are juxtaposed and almost aligned with each other. One of the cold arm members (30) preferably has a flat tip member (60) while the opposite one has a rounded tip member (60). The MEMS switch (100) is closed by moving the actuators (10,10') until their tip members (60) are engaged one over the other. This is achieved using the following sequence: activating the first actuator (10), activating the second actuator (10'), releasing the first actuator (10) and then releasing the second actuator (10'). The interference between the parts will allow them to remain in engagement until the releasing sequence is initiated. This consist in activating both actuators (10,10') at the same time, releasing the second actuator (10') and then releasing the first actuator (10). It should be noted that additional dielectric tethers (50) can be used in this embodiment as well.

Figure 17:
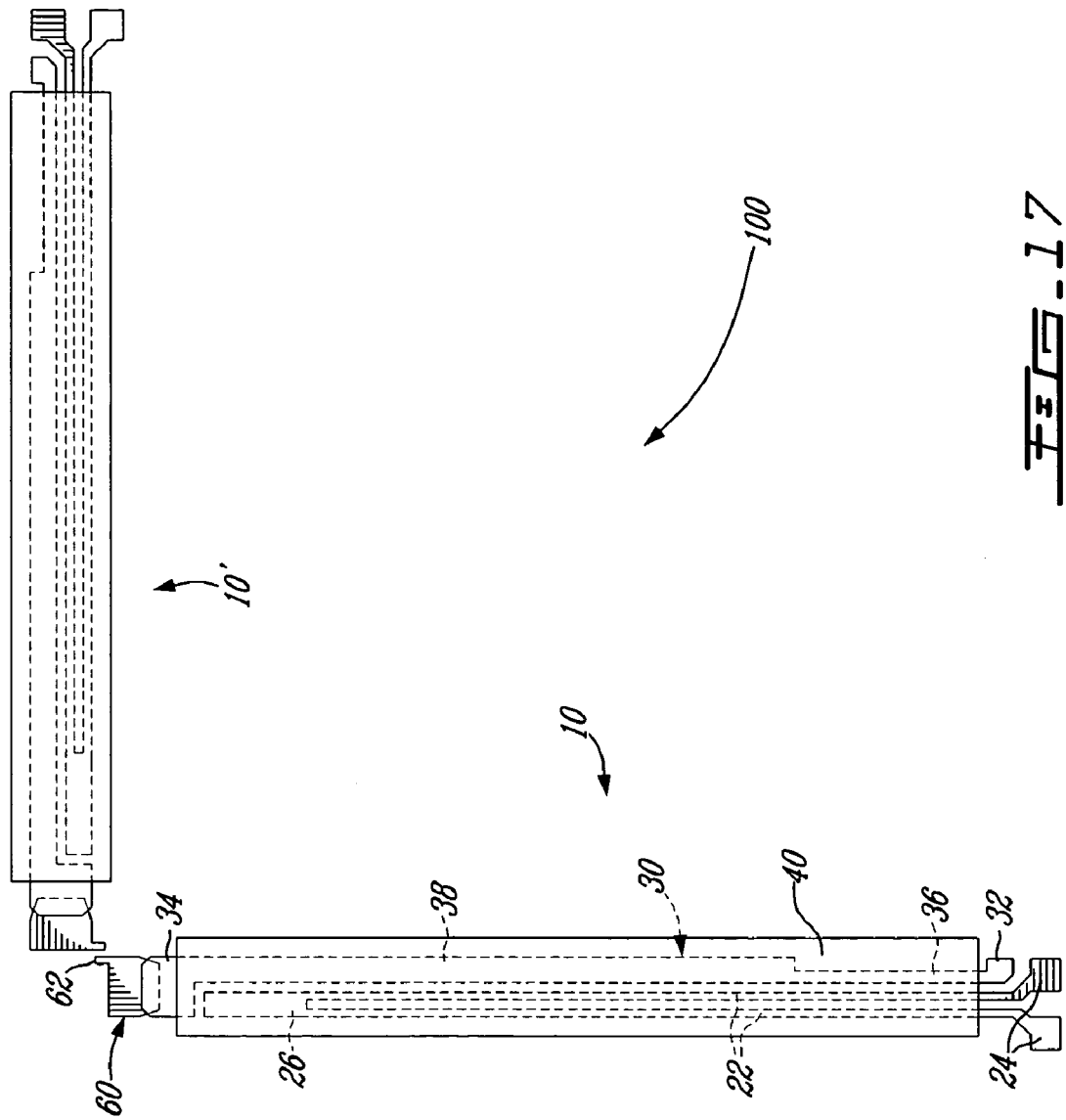

FIG. 17 illustrates an embodiment where each actuator (10,10') is provided with an enlarged main dielectric tether (40) that covers more than half of the surface of the parts. The material or materials used for making this tether (40) are selected so that it has some degree of elasticity and allow the actuator (10,10') to deflect when the control voltage is applied at the corresponding anchor pads (24) of the hot arm member (20). Using such enlarged dielectric tether (40) on at least one of the actuators (10,10') has many advantages. One of them is that it acts as a heat sink for the hot arm member (20), thereby enabling a more even temperature distribution along the hot arm member (20) to avoid potentially damaging hot spots. The same applies for the cold arm member (30) when a signal or a current flow through the MEMS switch (100).

Figure 18:
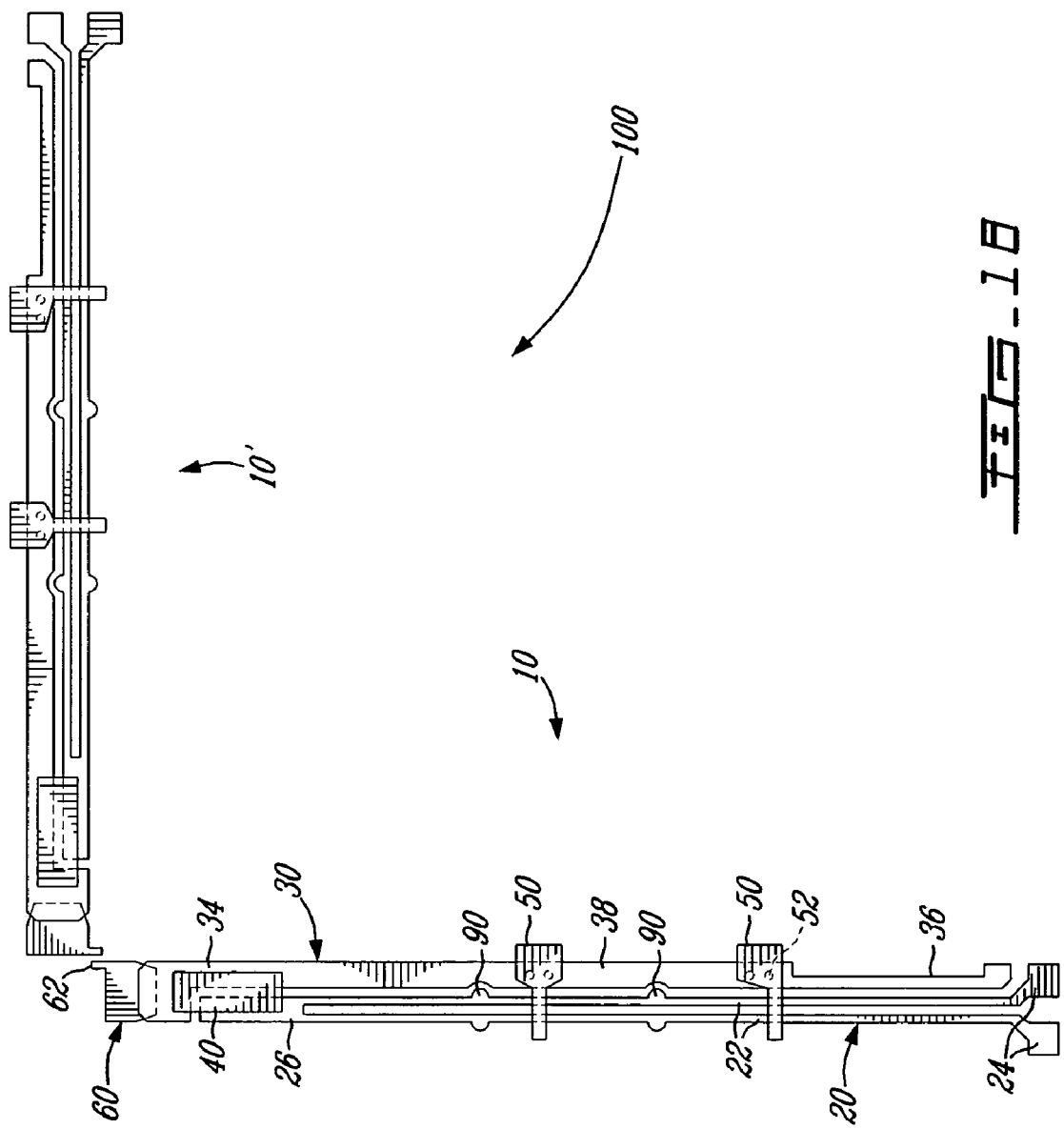

FIG. 18 illustrates a further embodiment where each actuator (10,10') is provided with heat sinks (90) on the portions (22) of the hot arm member (20). These heat sinks (90) are preferably in the form of enlarged and sideward-projecting areas. They are located where hot spots occur or are likely to occur, thereby enabling a more even temperature distribution along the hot arm member (20).

As aforesaid, FIG. 19 illustrates an embodiment in which the narrow section (36) of each actuator (10,10') has a parabolic shape.

What is claimed is:

1. A MEMS cantilever actuator mounted on a substrate, the actuator comprising:
   an elongated hot arm member having two spaced-apart portions, each provided at one end with a corresponding anchor pad connected to the substrate, the portions being connected together at a common end that is opposite the anchor pads;
   an elongated cold arm member adjacent and substantially parallel to the hot arm member, the cold arm member having at one end an anchor pad connected to the substrate, and a free end that is opposite the anchor pad thereof; and
   a dielectric tether attached over the common end of the portions of the hot arm member and the free end of the cold arm member to mechanically couple the hot arm member and the cold arm member and keep them electrically independent.

2. The actuator according to claim 1, wherein the dielectric tether is at least partially made of a photoresist material.

3. The actuator according to claim 2, wherein the photoresist material comprises SU-8.

4. The actuator according to claim 1, wherein the dielectric tether is at least partially made of a polyimide.

5. The actuator according to claim 1, wherein the dielectric tether is at least partially made of spin on glass.

6. The actuator according to claim 1, further comprising at least one additional dielectric tether transversally disposed over the hot arm member and the cold arm member.

7. The actuator according to claim 6, wherein the actuator comprises two spaced-apart additional dielectric tethers.

8. The actuator according to claim 6, wherein the additional dielectric tether comprises at least one portion retained in a hole provided on the cold arm member.

9. The actuator according to claim 6, wherein the additional dielectric tether is at least partially made of a photoresist material.

10. The actuator according to claim 9, wherein the photoresist material comprises SU-8.

11. The actuator according to claim 6, wherein the additional dielectric tether is at least partially made of a polyimide.

12. The actuator according to claim 6, wherein the additional dielectric tether is at least partially made of spin on glass.

13. The actuator according to claim 1, wherein the cold arm member comprises a narrower section adjacent to the anchor pad thereof, the narrower section having a width laterally decreased from the exterior compared to a wider section of the cold arm member.

14. The actuator according to claim 13, wherein the narrower section and the wider section are delimited by a square-shaped transition.

15. The actuator according to claim 13, wherein the narrower section and the wider section are delimited by a parabolic transition.

16. The actuator according to claim 13, wherein the narrower section of the cold arm member comprises a heat sink.

17. The actuator according to claim 13, wherein the cold arm member comprises a by-pass segment to reduce the current going through the narrower section.

18. The actuator according to claim 13, wherein the narrower section of the cold arm member is U-shaped.

19. The actuator according to claim 13, wherein the narrower section of the cold arm member is L-shaped.

20. The actuator according to claim 13, wherein the wider section of the cold arm member comprises at least one subsection having an increased interspace with the hot arm member.

21. The actuator according to claim 1, further comprising a tip member attached to the free end of the cold arm member.

22. The actuator according to claim 21, wherein the tip member comprises at least one lateral contact flange.

23. The actuator according to claim 22, wherein one side of the flange is provided with an electrical insulation layer.

24. The actuator according to claim 22, wherein one side of the flange comprises a rounded electrical contact surface.

25. The actuator according to claim 1, further comprising a heat sink on at least one of the portions of the hot arm member.

26. The actuator according to claim 1, wherein the dielectric tether covers more than half of the hot arm member and the cold arm member.

27. A MEMS switch mounted on a substrate, the switch comprising:
- a first cantilever actuator comprising: a first elongated hot arm member having two spaced-apart portions, each provided at one end with a corresponding anchor pad connected to the substrate, the portions of the first hot arm member being connected together at a common end that is opposite their anchor pads;
- a first elongated cold arm member adjacent and substantially parallel to the first hot arm member, the first cold arm member having at one end an anchor pad connected to the substrate, and a free end that is opposite the anchor pad thereof; and
- a first dielectric tether attached over the common end of the portions of the first hot arm member and the free end of the first cold arm member to mechanically couple the first hot arm member and the first cold arm member and keep them electrically independent; and
- a second cantilever actuator comprising:
- a second elongated hot arm member having two spaced-apart portions, each provided at one end with a corresponding anchor pad connected to the substrate, the portions of the second hot arm member being connected together at a common end that is opposite their anchor pads;
- a second elongated cold arm member adjacent and substantially parallel to the second hot arm member, the second cold arm member having at one end an anchor pad connected to the substrate, and a free end that is opposite the anchor pad thereof; and
- a second dielectric tether attached over the common end of the portions of the second hot arm member and the free end of the second cold arm member to mechanically couple the second hot arm member and the second cold arm member and keep them electrically independent;
- wherein the first actuator and the second actuator are configured and disposed so that the switch is selectively movable between a closed position where the free ends of the cold arm members are electrically engaged, and an open position where the cold arm members are electrically independent.

28. The MEMS switch according to claim 27, wherein the dielectric tethers re at least partially made of a photoresist material.

29. The MEMS switch according to claim 28, wherein the photoresist material comprises SU-8.

30. The MEMS switch according to claim 27, wherein the dielectric tethers are at least partially made of a polyimide.

31. The MEMS switch according to claim 27, wherein the dielectric tethers are at least partially made of spin on glass.

32. The MEMS switch according to claim 27, further comprising at least one additional dielectric tether transversally disposed over the hot arm member and the cold arm member of at least one of the actuators.

33. The MEMS switch according to claim 27, wherein the cold arm member of each actuator comprises a narrower section adjacent to the anchor pad thereof, each narrower section having a width laterally decreased from the exterior compared to a wider section of the corresponding cold arm member.

34. The MEMS switch according to claim 33, wherein the narrower section of the cold arm member of at least one of the actuators comprises a heat sink.

35. The MEMS switch according to claim 33, wherein the cold arm member of at least one of the actuators comprises a by-pass segment to reduce the current going through the narrower section.

36. The MEMS switch according to claim 33, wherein the narrower section of the cold arm member of at least one of the actuators is U-shaped.

37. The MEMS switch according to claim 33, wherein the narrower section of the cold arm member of at least one of the actuators is L-shaped.

38. The MEMS switch according to claim 33, wherein the wider section of the cold arm member of at least one of the actuators comprises at least one subsection having an increased interspace with the corresponding hot arm member.

39. The MEMS switch according to claim 27, wherein the actuators are configured and disposed to be substantially perpendicular.

40. The MEMS switch according to claim 39, wherein at least one of the actuators further comprises a tip member attached to the free end of the corresponding cold arm member.

41. The MEMS switch according to claim 40, wherein each tip member comprises at least one lateral contact flange, whereby the flanges are in electrical engagement when the MEMS switch is at the closed position thereof.

42. The MEMS switch according to claim 40, wherein surfaces of the tip members are made of a material providing, when mutually-engaged, a lower contact resistance compare to the contact resistance using a material of which the cold arm members are made.

43. The MEMS switch according to claim 42, wherein the material of the surface of each tip member comprises gold and the material of each cold arm member comprises nickel.

44. The MEMS switch according to claim 43, wherein each hot arm member is made of a material comprising nickel.

45. The MEMS switch according to claim 41, wherein one side of the flange of each tip member is provided with an electrical insulation layer, whereby the electrical insulation layers are facing each other at the open position of the MEMS switch.

46. The MEMS switch according to claim 40, wherein the tip member of one of the actuators comprises a lateral contact flange and the tip member of the other actuator comprises an indentation to receive a free end of the flange, whereby the flange and the indentation are in electrical engagement when the MEMS switch is at the closed position thereof.

47. The MEMS switch according to claim 27, further comprising at least one independent side arm member adjacent to one of the actuators, whereby electrical engagement is made between the cold arm member of the corresponding actuator and the independent side arm member when the MEMS switch is at the closed position thereof.

48. The MEMS switch according to claim 27, further comprising a third cantilever actuator adjacent to and symmetrically disposed on the side of the second actuator, the second and the third actuator being configured and disposed so that the cold arm members of the second and third actuators electrically engage that cold arm member of the first actuator when the MEMS switch is at the closed position thereof.

49. The MEMS switch according to claim 48, wherein the first actuator comprises electrically-independent dual cold arm members, each cold arm member of the first actuator being electrically engageable with a respective one of the cold arm member of the second and third actuator when the MEMS switch is at the closed position.

50. The MEMS switch according to claim 27, wherein the first and the second actuator are substantially parallel and offset with reference to the other, the actuators being configured and disposed so that their free ends are in interfering engagement at the closed position of the MEMS switch and out of engagement at the open position thereof.

51. The MEMS switch according to claim 50, wherein at least one of the actuators further comprises a tip member attached to the free end of the corresponding cold arm member.

52. A method of manufacturing a MEMS cantilever actuator to be mounted on a substrate, the method comprising:
   providing an elongated hot arm member having two spaced-apart portions, each provided at one end with a corresponding anchor pad connected to the substrate, the portions being connected together at a common end that is opposite the anchor pads;
   providing an elongated cold arm member adjacent and substantially parallel to the hot arm member, the cold arm member having at one end an anchor pad connected to the substrate, and a free end that is opposite the anchor pad thereof; and
   providing a dielectric tether over the common end of the portions of the hot arm member and the free end of the cold arm member to mechanically couple the hot arm member and the cold arm member and keep them electrically independent.

53. The method according to claim 52, further comprising:
   transversally attaching at least one additional dielectric tether over the hot arm member and the cold arm member.

54. The method according to claim 52, further comprising:
   providing a tip member at the free end of the cold arm member.

55. The method according to claim 54, wherein the tip member is attached to the free end of the cold arm member by natural over plating adhesion.

56. The method according to claim 54, further comprising:
   providing the tip member with at least one lateral contact flange.

57. The method according to claim 56, further comprising:
   providing an electrical insulation layer on one side of the flange.

* * * * *